US006952788B2

(12) United States Patent
Rommelmann et al.

(10) Patent No.: US 6,952,788 B2
(45) Date of Patent: Oct. 4, 2005

(54) CUSTOMER REPLACEMENT UNIT MONITOR PROGRAMMING CABLE

(75) Inventors: Heiko Rommelmann, Penfield, NY (US); Louis B. La, Ontario, NY (US); Alberto Rodriguez, Webster, NY (US); Edwin Kuyt, Marion, NY (US)

(73) Assignee: Xerox Corporation, Stamford, CT (US)

( * ) Notice: Subject to any disclaimer, the term of this patent is extended or adjusted under 35 U.S.C. 154(b) by 570 days.

(21) Appl. No.: 10/063,765

(22) Filed: May 10, 2002

(65) Prior Publication Data

US 2003/0212836 A1 Nov. 13, 2003

(51) Int. Cl.⁷ .................................................. G06F 1/26
(52) U.S. Cl. ........................... 713/340; 702/17; 702/62; 713/330; 713/300
(58) Field of Search ................................. 713/340, 300, 713/330; 702/17, 62

(56) References Cited

U.S. PATENT DOCUMENTS

| | | | | |
|---|---|---|---|---|
| 5,155,704 A | * | 10/1992 | Walther et al. | 365/201 |
| 5,668,419 A | * | 9/1997 | Oktay | 307/126 |
| 5,797,771 A | * | 8/1998 | Garside | 439/610 |
| 6,346,827 B1 | * | 2/2002 | Yeung et al. | 326/41 |
| 6,361,357 B1 | * | 3/2002 | Stillwell et al. | 439/490 |

OTHER PUBLICATIONS

ALTERA Corporation, Application Note 59, Dec. 1995, Ver. 1.*

* cited by examiner

Primary Examiner—Thomas C. Lee
Assistant Examiner—Vincent Tran
(74) Attorney, Agent, or Firm—Oliff & Berridge, PLC

(57) ABSTRACT

A hardware interface usable to communicate with electrically erasable read-only memory devices and, optionally, other external controls or devices, includes self-monitoring power supply circuitry, an EEPROM driver and noise and signal degradation prevention circuitry, and optional input/output circuitry which provides for programmatically cycling power to the memory device. The self-monitoring power supply circuitry is capable of determining whether a power supply has reached the hardware interface. The EEPROM driver and noise and signal degradation prevention circuitry reduces signal noise and/or signal degradation and driver circuitry for programming, monitoring, and downloading information to and from the EEPROM devices. The digital input/output circuitry is capable of controlling the power supply to the hardware interface, downloading or monitoring information to the hardware interface, or controlling/responding to external devices or controls.

19 Claims, 10 Drawing Sheets

CUSTOMER REPLACEMENT UNIT MONITOR PROGRAMMING CABLE

BACKGROUND OF INVENTION

1. Field of Invention

This invention is directed to a device useable to read and program electrically erasable read-only memory devices.

2. Description of Related Art

U.S. Pat. No. 6,173,128 discloses a digital printing apparatus which employs specially-adapted memory devices called "customer replaceable unit monitors", or CRUMs, which are associated with one or more customer-replaceable modules within the digital printing apparatus. In one exemplary embodiment of the invention disclosed in the '128 patent, a customer-replaceable unit monitor is in the form of a 2K-bit electrically erasable programmable read only memory (EEPROM). The '128 patent provides for reading a set of codes from the EEPROM forming each customer replaceable unit monitors", and noting whether certain combinations of codes appear in the customer replaceable unit monitor data. These certain combinations of codes indicate that specific remanufacturing procedures, particularly the replacement of parts, is mandated. Thus, a module, which has been retrieved, for example, from a digital printer in the field, can be sent through an automated assembly-line process in which various specific parts in the module are replaced.

FIG. 2 of the '128 patent illustrates a process for determining the required remanufacturing steps. The first step involves reading the EEPROM forming a customer replaceable unit monitor, and applying, to the various codes stored in the customer replaceable unit monitor, a series of algorithms to determine which parts, if any, within the module need to be replaced. After the algorithms are applied, the EEPROM is reset by erasing any fault codes or error codes, and setting to zero certain print-count or pixel-count codes. In some cases, "resetting" the customer replaceable unit monitor may in fact involve replacing the old EEPROM entirely.

FIG. 1 illustrates one conventional programming interface device 1000 usable for reading and/or programming customer replacement unit monitors. As shown in FIG. 1, the conventional programming interface device 1000 includes two connecting cables 1010 and 1030 and a programming interface module 1020 containing electronic circuit elements forming the programming interface. The bulkiness of the conventional programming hardware interface device 1000 prevents the programming hardware interface device 1000 from being easily portable. Conventionally, the programming hardware interface used for programming customer replacement unit monitors is fabricated on either a wire-wrapped board, or on a plug board, and housed inside the programming hardware interface module 1020. These packaging methods are expensive because of the hardware conventionally used, such as a large metal box, to house the circuit board, and the electrical components mounted on the circuit board.

Additionally, the conventional programming hardware device 1000 is likely to fail because it is prone to noise and signal degradation that typically exists in a manufacturing environment.

SUMMARY OF INVENTION

The invention provides a simplified hardware interface usable to program electrically erasable read-only memory devices.

This invention separately provides a hardware interface, usable to program electrically erasable read-only memory devices, that is integrated into a connecting cable.

This invention separately provides a hardware interface usable to program electrically erasable read-only memory devices of customer replacement unit monitors.

This invention separately provides a hardware interface, usable to program electrically erasable read-only memory devices, that includes noise and/or signal degradation protection circuitry.

This invention separately provides a hardware interface, usable to program electrically erasable read-only memory devices, that has a self-monitoring power supply.

This invention separately provides a hardware interface, usable to program electrically erasable read-only memory devices, that has a detector window.

This invention separately provides a hardware interface that has driver circuitry usable to program electrically erasable read-only memory devices and download or monitor information on the customer replacement unit monitor's erasable programmable read-only memory.

This invention separately provides a hardware interface usable to program electrically erasable read-only memory devices integrated into a customer replacement unit monitor.

This invention separately provides a hardware interface that has digital input/output circuitry that is, primarily usable to control the power supply to the hardware interface, but that can also perform other functions.

This invention separately provides a hardware interface that has digital input/output circuitry optionally usable to monitor external devices or controls.

This invention separately provides a hardware interface that has digital input/output circuitry usable to control external devices.

This invention separately provides a hardware interface that has digital input/output circuitry optionally usable as part of a test system.

The invention separately provides systems and methods that reduce the occurrence of what is characterized as "hot socketing", i.e., arcs and/or voltage sparks generated when a CRUM assembly is connected to a power supply, thereby reducing the occurrence of data corruption and physical damage to a CRUM assembly.

In various exemplary embodiments of the hardware interface usable to program customer replacement unit monitors according to this invention, the driver circuitry of the hardware interface usable to drive an electrically erasable programmable read-only memory (EEPROM) is located within a connector attached to a cable. The EEPROM device may be integrated into another device, such as a customer replacement unit monitor. One end of the cable is connectable to the electrically erasable read-only memory device. The other end of the cable is connectable to a central processing unit.

In various exemplary embodiments of the hardware interface usable to program electrically erasable read-only memory devices according to this invention, the hardware interface includes circuitry usable to self-monitor the power supply to the programming cable, where this circuitry is located within the connector. This circuitry is usable by the EEPROM programming software tool to detect and report absence of power being supplied to the cable, among others. In various exemplary embodiments of the hardware interface usable to program electrically erasable read-only memory devices, the hardware interface includes a detector window with an indicator, such as, for example, a light emitting diode, that indicates whether power is being supplied to the cable.

In various exemplary embodiments of the hardware interface usable to program electrically erasable read-only memory devices according to this invention, the hardware interface includes circuitry usable to protect the hardware interface from noise and/or signal degradation. This circuitry prevents noise and electrical interference that typically exists in the manufacturing environment from adversely affecting the hardware interface.

In various exemplary embodiments of the hardware interface usable to program customer replacement unit monitors according to this invention, the hardware interface includes driver circuitry to program the electrically erasable programmable memory (EEPROM) devices, which may be incorporated into other devices, such as customer replacement unit monitors, and to monitor or download information contained in the erasable programmable read-only memory devices for diagnostic purposes.

In various exemplary embodiments of the hardware interface usable to program electrically erasable read-only memory devices according to this invention, the hardware interface includes digital input/output interface circuitry that is primarily usable to control the power supply to the hardware interface.

In various exemplary embodiments of the hardware interface usable to program electrically erasable read-only memory devices according to this invention, the hardware interface includes digital input/output interface circuitry and a cable to optionally control or monitor external devices, or receive inputs from external devices.

According to various exemplary embodiments of the hardware interface usable to electrically erasable read-only memory device according to this invention, the size of the hardware interface is reduced, the reliability is improved, and the capabilities of the hardware interface is increased.

According to this invention, the entire electronic circuitry fits conveniently inside a connector, such as a 25-pin sub-connector, as shown in FIG. 2. The new packaging is inexpensive, compact and easily portable.

These and other features and advantages of this invention are described in, or are apparent from, the following detailed description of various exemplary embodiments of the systems and methods according to this invention.

BRIEF DESCRIPTION OF DRAWINGS

Various exemplary embodiments of this invention will be described in detail, with reference to the following figures, wherein.

DETAILED DESCRIPTION OF EXEMPLARY EMBODIMENTS

Figure 1:
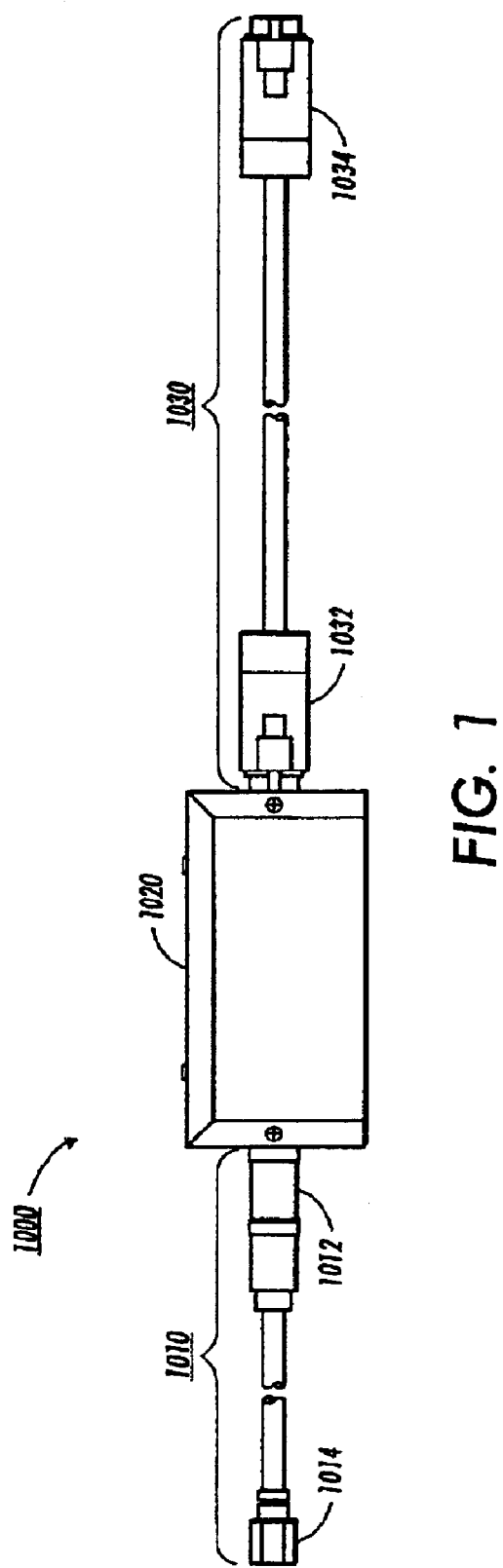
FIG. 1 is a diagram showing an exemplary conventional hardware interface for programming electrically erasable read-only memory devices.
Figure 2:
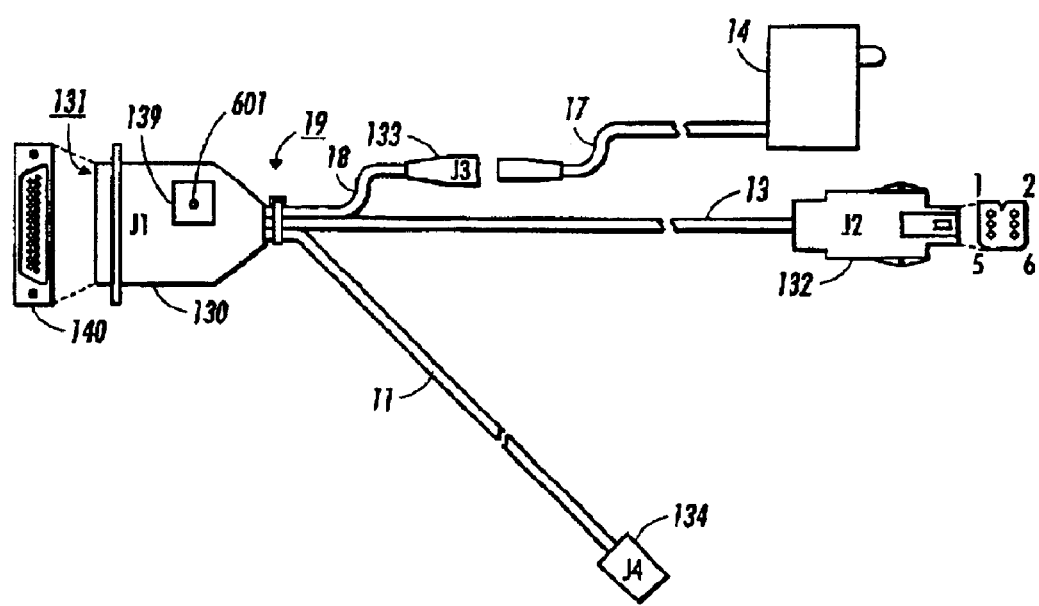
FIG. 2 is a diagram showing an exemplary hardware interface according to the invention for programming electrically erasable read-only memory devices.
Figure 3:
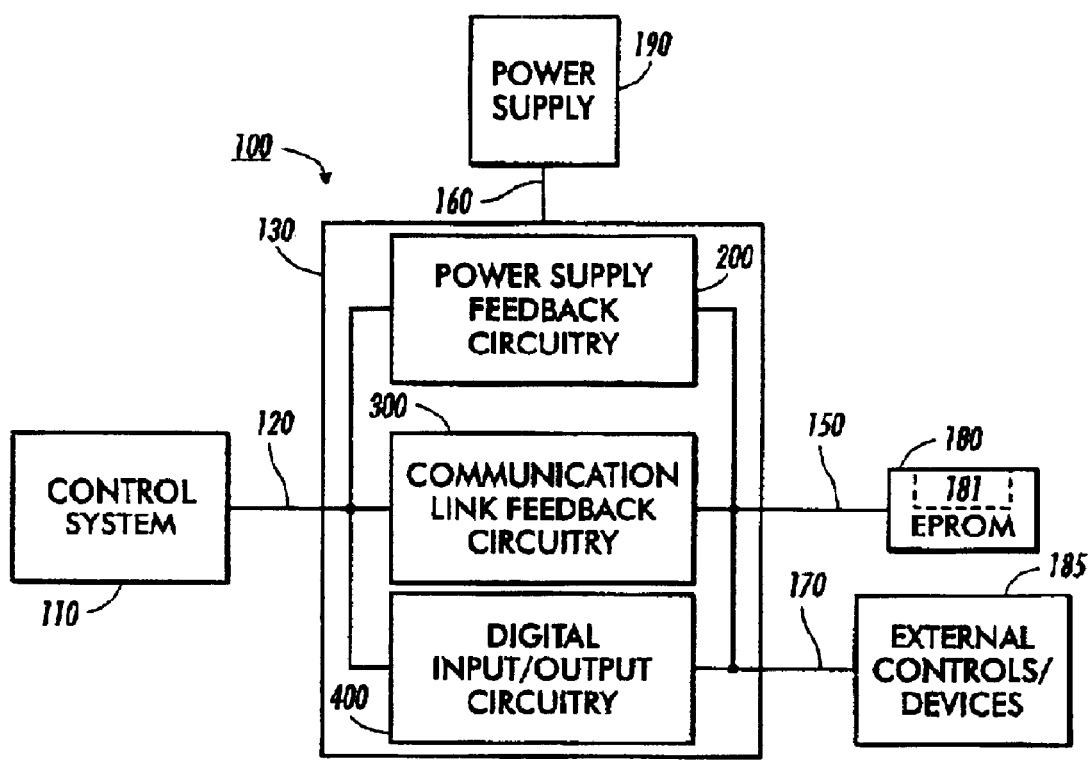
FIG. 3 is a block diagram depicting one exemplary embodiment of the components of an integrated connection cable and hardware interface connectible to an electrically erasable read-only memory device according to this invention.

FIG. 2 shows one exemplary embodiment of a hardware interface 100 usable to program electrically erasable read-only memory devices according to this invention. As shown in FIG. 2, the hardware interface 100 includes a connector element 130 that includes a combined circuit board and printed wire circuit board assembly, which has a standard computer parallel interface 131 connector connectable to a standard parallel port mating connector 140. A cable 13 connects the connector element 130 to a serial interface connector 132 which is configured to connect to the serial interface connector of a customer replacement unit monitor (CRUM). As shown in FIG. 3, the customer replacement unit monitor 180 contains a memory device 181, such as, for example, an EEPROM. The connector element 130 is also shown connected via a cable 18 to a connector 133 as in FIG. 2. The connector 133 is connectable to a cable 17, which is connected to a 5 volt DC power supply 14. The power supply 14 may be an AC to DC converter. A 20-pin amplifier connector 134 may be connected via a cable 11 to a parallel port 131. The cables 11, 13 and 18 may be fastened together and/or to the connector element 130 by a fastener, such as, for example, a clamp 19.

FIG. 3 is a block diagram of one exemplary embodiment of the components of the integrated connection cable and hardware interface 100 according to this invention that is connectible to the electrically erasable read-only device 180. The electronic circuitry of the connection cable and hardware interface 100 includes a power supply feedback circuit 200, noise and/or signal degradation prevention and communication link feedback circuitry 300 and optionally, a digital input/output circuit 400.

Figure 4:
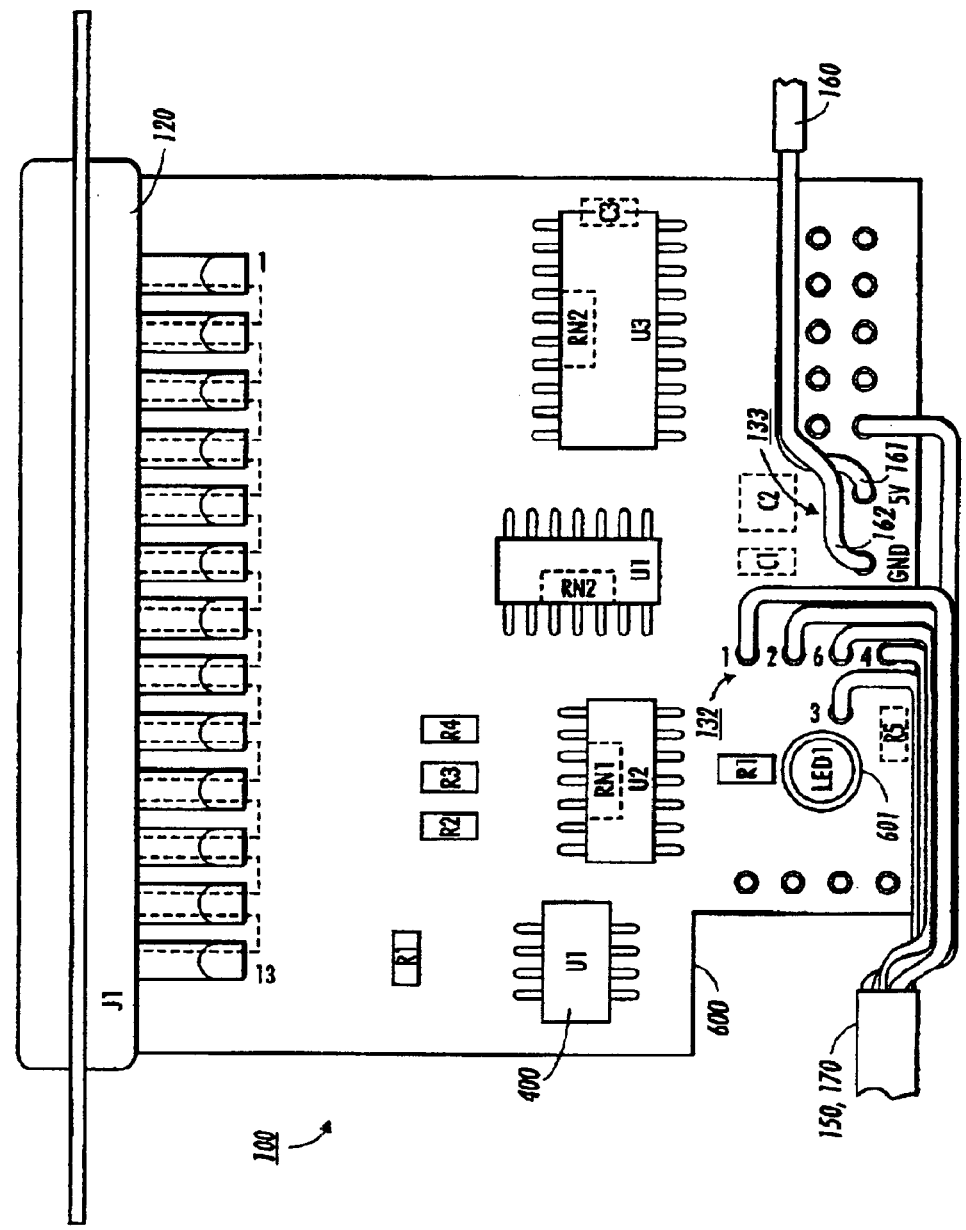
FIG. 4 is a plan view of an exemplary embodiment of hardware interface circuit elements located inside a connector of the integrated connector cable and hardware interface according to this invention.

The self-monitoring power supply feedback circuitry 200, the noise and/or signal degradation prevention circuitry 300 and the digital input/output circuit 400, if provided, are shown in FIG. 4, and are implemented using a circuit board 600 located inside of the connector element 130 of the hardware interface 100. A serial port connection 132 to the circuit board inside the connector element 130 is provided from the electronic circuitry on the circuit board 600 to connect the hardware interface 100 to the EEPROM device 181 via a connection 150. Another connection 120 to the circuit board 600 inside the connector element 130 is provided from the electronic circuitry on the circuit board 600 of the hardware interface 100 to a remotely-located control system 110, such as a computer. One of the connections 150 can be a cable, while the other connection 120 can be a multi-pin connection structure of the connector element

150. In various exemplary embodiments, a ribbon cable is usable as the connector 150. In such a situation, the ground shields in between and around the conductors help reduce communication errors. The third connector 133 is connected to the circuit board 600 and supplies a +5 Vdc power supply signal from a power supply 190 over a connection 160 to the electronic circuitry on the circuit board 600. An optional fourth cable 170 is provided to transmit and/or receive digital inputs/outputs between the hardware interface 100 and external devices or controls 185.

The hardware interface 100 is capable of monitoring the power supply 190 by itself. As shown in FIG. 2, in various exemplary embodiments, a detector window 139 can be provided in the connector element 130 to allow the user to quickly and visually determine whether power is supplied to the hardware interface 100. In various exemplary embodiments, the detector window 139 is an opening in the connector element 130 that exposes a light emitting diode 601 shown in FIG. 2. The light emitting diode 601 in the detector window 139 may be used to obtain a visual indication of whether or not power is reaching the hardware interface circuitry. In various exemplary embodiments, the light emitting diode extends out of the connector element 130 through detector window 139. In this case, the light emitting diode 601 can be seen from other than a view that is substantially opposite the detector window 139.

The application software in the remotely located control system is designed to work in conjunction with the feedback circuitry to provide failure specific messages to the user to enable system trouble-shooting. The application software is capable, for example, of detecting the presence of power to the circuitry, parallel resource allocation problems such as incorrect base address, missing interface from parallel port, device missing or failure to respond, SCL and/or SDA communication propagation problems. The software is also capable of controlling power application to the EEPROM device. Additionally, by only applying power during communication sequencing, and removal of power at all other times, the possibility of hot-socketing is controlled and minimized. With these hardware and software interactions and messages a user of the hardware interface 100 can more easily and certainly ascertain whether the hardware and/or the software of the remotely-located control system host 110 and/or the EEPROM device 181 has failed, or whether the power supply to the hardware interface 100 has failed. Moreover, a user of the hardware interface can also observe the light emitter 601 to determine when the power to the EEPROM is on or off.

Table I shows a sample pseudocode which may be used to control electrical power to a customer replacement user module assembly via a computer program.

TABLE I

```
# include <stdlo.n>
#include <dos.h>
include <conio.h>
void main (void)
{
    while(1)
    {
        switch (getch0)
        {
        case '0';
        clrscr0;
        outportb(PORT,OFF);
        printf("CRUM POWER OFF");
        break;
```

TABLE I-continued

```
        case '1';
        clrscr0;
        outportb(PORT,ON);
        printf("CRUM POWER ON");
        break;
        default;
        exit(0);
        }
    }
}
```

The hardware interface 100 allows manufacturing engineers or technicians to easily program and verify EEPROM devices 181 that have been integrated into customer replacement unit monitors 180 within newly-built or remanufactured machines and allows field service technicians to easily interrogate the EEPROM devices 181. The hardware interface 100 is capable of programming EEPROM devices 181, including reading and writing to various EEPROM devices 181, which may be integrated into customer replacement unit monitors 180.

FIG. 4 shows, in plan view, an exemplary embodiment of an arrangement of the customer replacement unit monitor elements on the circuit board 600 inside of connector element 130. The cable 160 includes leads 161 and 162 from the power supply 190. Those power supply leads 161 and 162 are connected to a +5V power supply terminal and a ground terminal GND, respectively. These terminals are part of connector 133. A number of leads from the EEPROM 181 are connected to serial interface 132 elements 132-1, 132-2, 132-3 and 132-4. The circuit board 600 also includes an octal 3-state buffer 400 with high output drive current that is used to power the memory device 181. The memory device power may be switched on or off to avoid hot socketing by toggling parallel port pin 131-17.

Figure 5A:
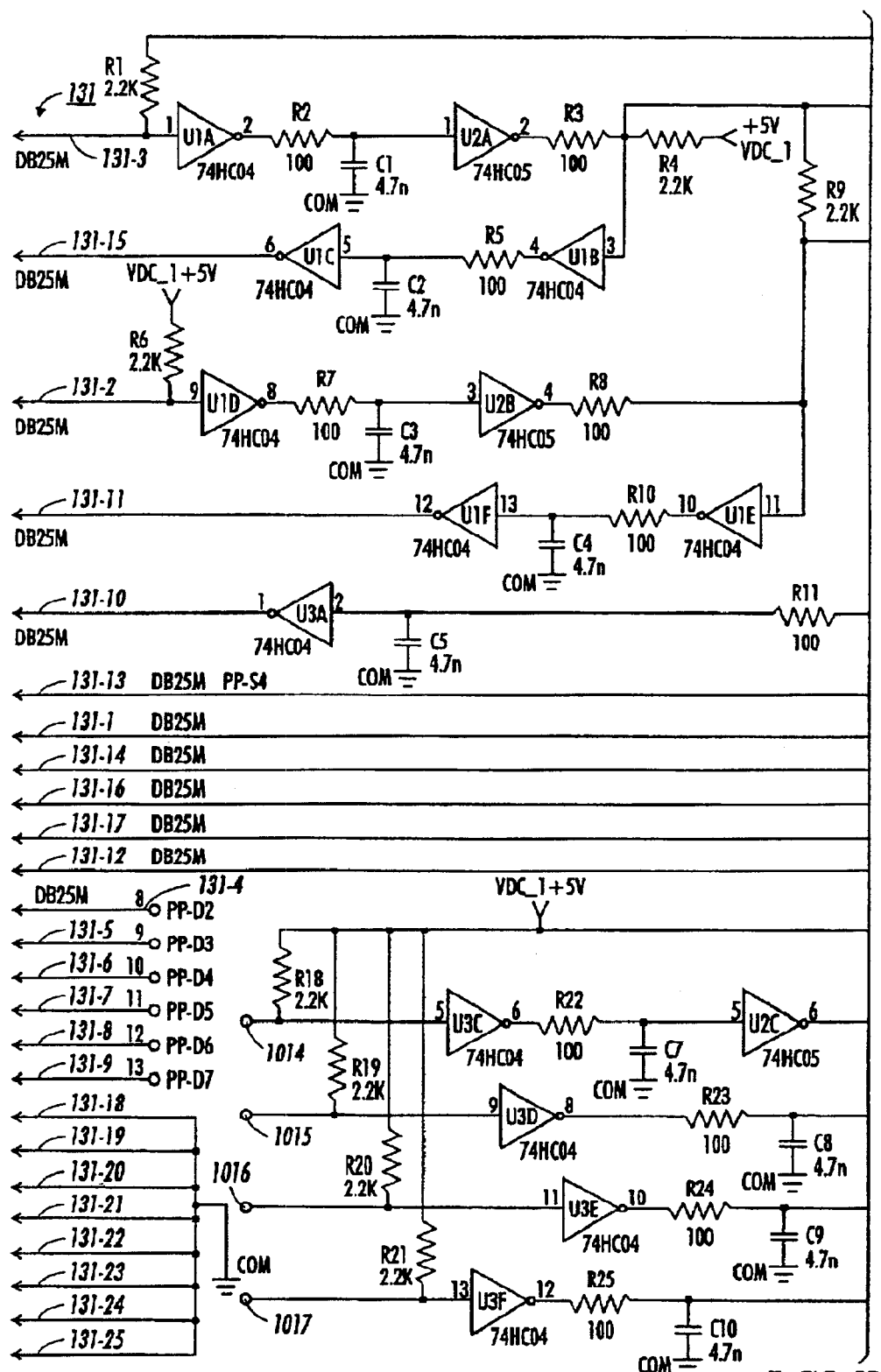
FIGS. 5A and 5B comprise a circuit diagram of an exemplary embodiment of the EEPROM driver and noise and signal degradation prevention circuitry of the hardware interface of FIG. 2 according to this invention.
Figure 5B:
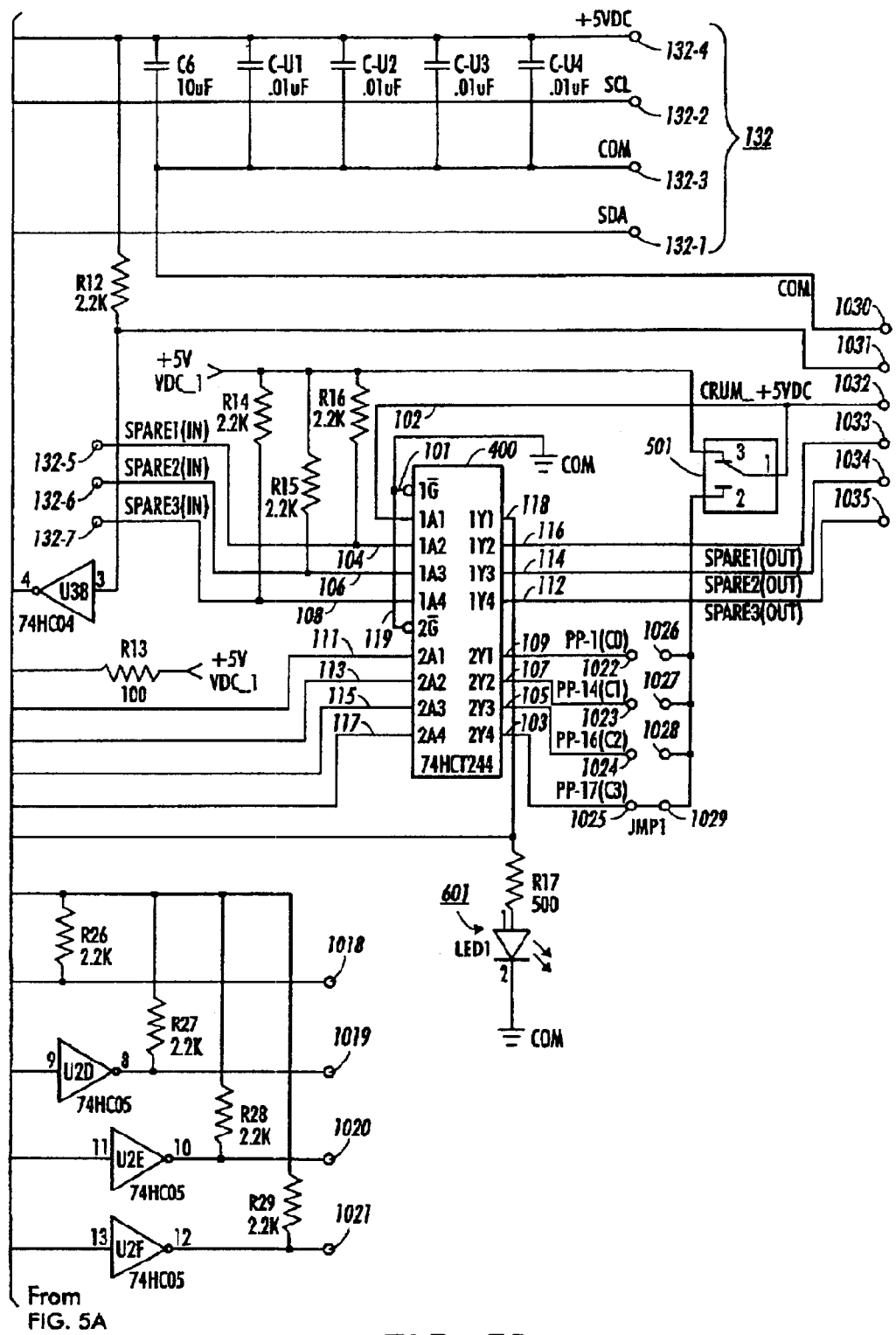

FIGS. 5A and 5B illustrate an exemplary embodiment of the EEPROM 181 and of the noise and/or signal degradation prevention circuitry and communication link feedback circuitry 300 according to this invention. The portion of FIGS. 5A and 5B other than the area contained between pads 1014–1021, which is a spare area fitted with a two-stage buffer and an RC filter network in between, contains the signal data lines (SDL) and signal clock lines (SCL) and feedback circuitry which is used to monitor serial data and serial clock communications. This portion of the circuitry 300, i.e., the portion of FIGS. 5A and 5B. contained and/or defined by elements 131,132, (where 131-3, 131-15 correspond to SCL and SCL feedback paths respectively, 131-2 and 131-11 represent SDA and SDA Feedback paths, respectively) and terminal pads 101, 102, 103,104, and 131. This portion of the circuitry contains signal and data lines and a feedback path that allows a remotely-located control system 110, such as, for example, a host application, to monitor communications between remotely-located control system 110 and memory device 181 of customer replacement unit monitor 180, in real time.

In operation, a remotely-located control system or host 110 may send a bit sequence to the customer unit replacement monitor. For proper operation, the bit sequence sent by the remotely-located control system should match the bus signal fed back to the remotely-located control system 110 along the feedback path of the communication link feedback circuitry 300. Should a discrepancy between the bus signal and the bit sequence sent by a host be detected on any of the two communication lines, that is, the serial data or the serial clock lines, connected to 132-1 and 132-2, respectively, the communication is aborted. A host 110 can conduct tests on the two communication lines 132-1 and 132-2 to learn the nature of the problem which caused the discrepancy between the bus signal and the bit sequence. As noted above, this is done by sending a known bit sequence to both communication lines 132-1 and 132-2 while the host monitors the actual signals through the feedback paths. The feedback paths are shown as connected to parallel port pins 131-10, 131-11, and 131-15.

In both the signal paths 132-1 and 132-2 to the memory device 181, as well as in the feedback paths, a simple RC network is connected in series with the memory device 181 to act as a low pass filter. Any noise introduced due to external noise, or any noise generated due to capacitive coupling between the clock and data lines 132-1 and 132-2, is minimized, thus avoiding signal corruption. This RC network also helps to filter any noise generated at the host interface 132. The host interface 132 may, for example, be a personal computer parallel port. This RC network is located between two inverting gates in each path that act as buffers between the host interface 132 and the customer replacement unit monitor 180 memory device 181.

A signal line 10-31, which connects parallel interface connector pin 131-10 to a terminal pad 31, corresponds to a return line that is not only filtered and buffered, but that may be used as a control input to a host 110.

A parallel port pin 131-13 provides a path through which a +5V signal can be read to validate that power is present.

An octal three-state buffer 400 with high output drive current that is used to power the memory device 181. By toggling power to the line 117 connected to parallel port pin 131-17, a host 110 is capable of switching on or off power to the memory device, thus avoiding hot socketing. As noted above, hot socketing may occur when the EEPROM or other device is connected or disconnected from the circuitry while the power is still being applied.

As shown in FIG. 5B, a switch 501 allows the user to configure the circuit 300 to apply continuous power to the memory device 181 to satisfy legacy implementations of the host 110 software, for example, or to avoid hot socketing. In that case, the host 110 controls when power is applied or removed from the customer replacement unit monitor, switch position 1, 2. Using the switch 501, the device power path is connected to the output of the tri-state buffer and controlled by the parallel port control line 131-17 which in turn can be used by the software to turn power on or off.

As discussed above, light emitting diode 601 indicates when power is applied to the consumer replacement unit monitor interface 100. The light emitting diode 601 is illuminated when power is supplied and not illuminated when power is not supplied.

The unused input/output combinations of octal 3-state buffer 400 are used as three unconnected spares and three power spares. In the event that the output of octal 3-state buffer 400 is used to power the consumer replacement unit monitor, the circuit default, octal 3-state buffer pin 2Y4, may be shorted out and damaged. In such a situation any of these three spares could be used to repair the circuit by simply jumping across any of the pad pairs depicted by 22–29.

As noted above, the area contained between the terminal pads 1014–1021 is a spare area fitted, like the signal and clock paths, with a two-stage buffer and an RC filter network in between. This area is intended to be used for control inputs or outputs for further expansion, such as, for example to interact with other hardware.

FIGS. 5A and 5B set forth specific values for each electrical component capacitor and resistor, and specify specific amplifiers by their commercial code designations. These values are illustrative only.

Figure 6:
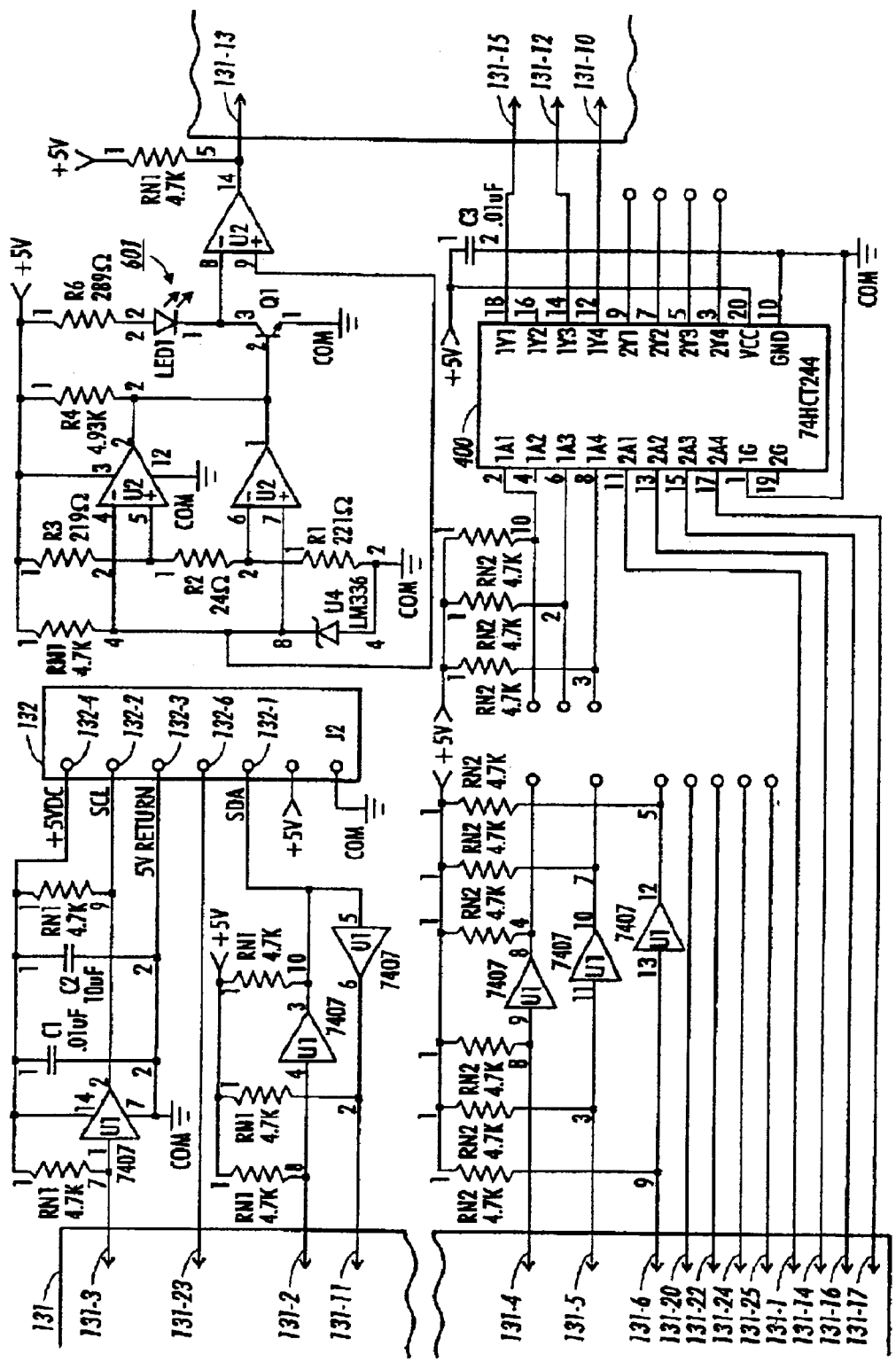
FIG. 6 is a circuit diagram of another exemplary embodiment of the EEPROM driver and without the noise and signal degradation prevention circuitry of the hardware interface of FIG. 2 according to this invention.

FIG. 6 shows a circuit diagram of another exemplary embodiment of a customer replacement unit monitor memory device driver and noise and signal degradation prevention circuitry of the hardware interface 100. The signal data and clock lines 132-1 and 132-2, respectively, and the feedback circuitry, which includes the line connected to parallel port pin 131-11, is depicted in FIG. 6. Similar elements in FIGS. 5A, 5B and FIG. 6 have the same label numbers.

The circuitry shown in FIG. 6 is used to monitor forward communications including serial data and serial clock lines. It provides a feedback path, connected to parallel port pin 131-11, that allows the host 110 to monitor communications between the host 110 and memory device 181 in real time. It should be appreciated that in the signal path to the memory device 181, which is connected to serial port 132, a simple RC network is in series to act as a low pass filter. Any noise introduced due to external noise or noise generated due to capacitive coupling between clock and data lines is reduced, thus reducing signal corruption. This RC network also helps to filter any noise generated at the host 110 interface 131.

FIG. 6 shows the +5 V DC power supply connected via a pin 4 of the interface 132. However, removal of the five volt dc connection from pin 4 of 132 and connecting pin 3 from element buffer 400 instead, is another exemplary embodiment of this invention which allows power to the customer replacement unit monitor assembly to be switched by one of the control lines of the parallel port signal line 131-17. This is possible due to the high drive current outputs, with a maximum of approximately 35 milliamps per pin, of the 74HCT244 integrated circuit shown in FIG. 7 and the low current consumption of the customer replacement unit monitor interface 100, which has a maximum high drive current output of approximately 1 mA. By turning on and off the parallel control line connected to parallel port pin 131-17 it is possible to programmatically cycle power at will to the customer replacement unit monitor interface 100.

The functionality described above may also be achieved in another exemplary embodiment according to the systems and methods according to this invention, by a connecting pin 19, labeled 2G enable, of the buffer 400 to the parallel port control pin 131-17. The pins 11, 13, 15 and 17 of the buffer 400 would be hard wired to a logical "1". In this case, all four available buffer outputs would be controlled by one parallel port control line, freeing the other three for other functions, as shown in FIG. 6.

An inspection of FIG. 6 reveals that serial data path is connected directly between terminal 132-1 and parallel port pins 131-2 and 131-11. As can be seen from FIG. 6, there are no provisions to minimize noise in that serial data path. Instead any noise will be propagated through the cable to the customer replacement unit monitor.

Figure 7:
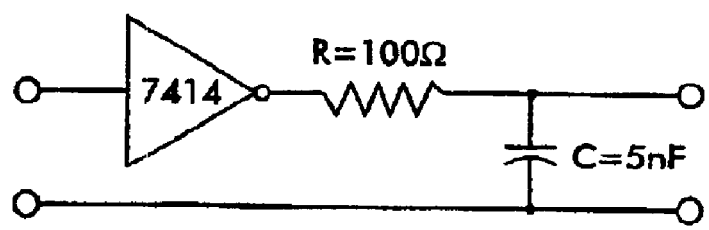
FIG. 7 shows an exemplary RC network low pass filter used between the parallel port and a customer replaceable unit monitor harness according to this invention.

By inserting the RC circuit shown in FIG. 7 in line between the parallel port and customer replacement unit monitor serial port 132 for the serial data and serial clock lines (connected to serial port 132 pins 1 and 2, respectively) it is possible to filter out most of the noise generated at the parallel port. FIG. 7 is a low-pass filter implemented by an RC network of values shown therein. As can be seen in FIG. 7, the value of the resistor is approximately 100 ohms and the value of the capacitor is approximately 5 nanofarads. This choice of values allows for an I2C (Inter Integrated Circuit) serial communications protocol, which is described for example, in the Philips Technologies publication "The I2C-bus and how to use it (including specifications)", April 1995, pp. 1–24, which is incorporated herein by reference in its entirety, 4.5 microsecond rise time requirement for the SDA and SCL to be met while removing high frequency components of the signal due to cross talk between the parallel port pins. A hex-inverting buffer may be used between the parallel port and the RC circuit to isolate the parallel port from the RC network and/or between the RC circuit and the EEPROM device again for isolation purposes.

In order to minimize signal cross talk at the customer replacement unit monitor cable level, in various exemplary embodiments, a ribbon cable with six conductors in a pattern where signal and ground are alternated, is used. The ground lines shield the signal lines from each other by dissipating noise generated during transitions of state. In other exemplary embodiments, the signal integrity is preserved by placing series resistors in line with the serial data and serial clock signals, such that the total resistance between pins 1 and 2 of serial interface 132 and the consumer replacement unit monitor cable is between 100Ω and 300Ω, and replacing the 4.3 K Ω pull-up resistors with 2 K Ω resistors. One may also improve signal performance by using a ribbon cable. Ω

Figure 8:
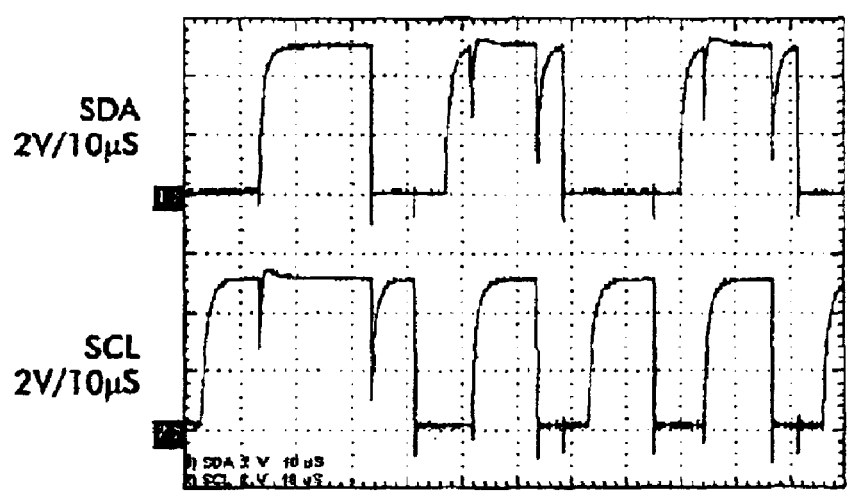
FIG. 8 is a pair of oscilloscope trace of signals using a standard customer replaceable unit monitor harness.
Figure 9:
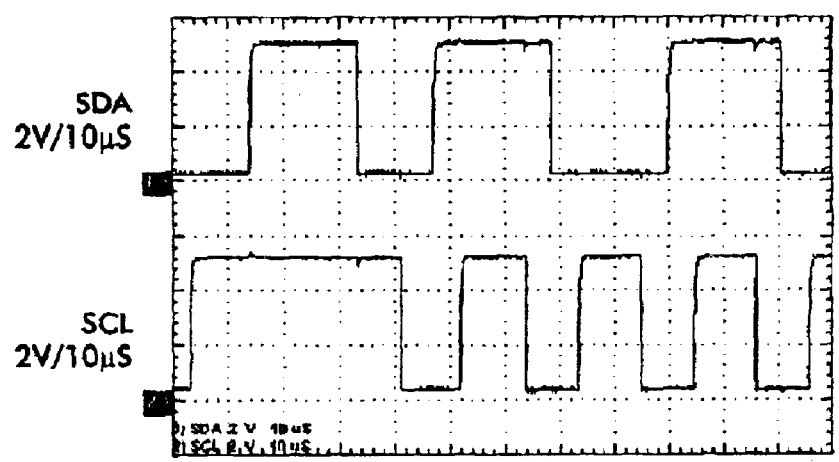
FIG. 9 is a pair of oscilloscope traces of signals using an enhanced customer replaceable unit monitor harness according to the invention.

FIG. 8A shows the serial data and serial clock signals, as captured by an oscilloscope, using a standard customer replacement unit monitor harness with none of the aforementioned enhancements, i.e., without lower impedance pull-up resistors, series resistors, ribbon cable and an RC filter. FIG. 8B shows the serial data and serial clock signals after the proposed changes were added to the customer replacement unit monitor harness. In other words, FIG. 8B discloses the signal as seen by the customer replacement unit monitor assembly after circuitry enhancements which include lower impedance pull-up resistors, series resistors, ribbon cable and an RC filter were added.

In various exemplary embodiments, the integrated connection cable and hardware interface 100 has one or more advantages over a conventional assembly, including size, cost, reliability, portability, and/or robustness. Also, the compact design of the integrated connection cable and hardware interface 100 allows integrated connection cable and hardware interface 100 to be easily carried anywhere. The integrated connection cable and hardware interface 100 can conveniently fit inside a briefcase for traveling to sites to program, interrogate and/or validate the EEPROM device 181 of a customer replacement unit monitor. According to this invention, the integrated connection cable and hardware interface 100 is more robust because all the integrated connectors and other components are securely house inside the connector element 130.

In various exemplary embodiments, the integrated connection cable and hardware interface 100, with its simplicity and design, can be perceived as an ordinary cable. In various exemplary embodiments, the integrated connection cable and hardware interface 100, according to this invention, also allows for reduced programming errors, due to the noise and signal degradation protection circuitry 300. Additionally, in various exemplary embodiments, the integrated connection cable and hardware interface 100, according to this invention, can quickly monitor or download critical information contained in the EEPROM device 181 of the customer replacement unit monitor for diagnostic purposes.

While this invention has been described in conjunction with the exemplary embodiments outlined above, which illustratively use an I2C, i.e., inter-IC control protocol, it is evident that many alternatives, modifications and variations will be apparent to those skilled in the art including those required for implementations using other serial communications protocols such as SPI. Accordingly, the exemplary embodiments of the invention, as set forth above, are intended to be illustrative, not limiting. Various changes may be made without departing from the spirit and scope of the invention.

What is claimed is:

1. A hardware interface usable to program one or more electrically erasable read-only memory devices, comprising: a cable; a terminal connector attached to the cable; a printed wire board assembly located in the terminal connector; digital input/output circuitry provided on the printed wire board assembly; self-monitoring power supply circuitry provided on the printed wire board assembly; and electrical noise and signal degradation reduction circuitry provided on the printed wire board assembly.

2. The hardware interface of claim 1, wherein the connector is a parallel port connector with one or more parallel control line, and further comprising circuitry provided on the printed wire board assembly to turn on and off a parallel control line to permit programmatic power cycling to a memory device.

3. The hardware interface of claim 2, wherein turning off of the parallel control line isolates the parallel port from a memory device.

4. The hardware interface of claim 3, further comprising a plurality of buffers, at least one of which is unused as part of the circuitry on the printed wire board assembly, the memory device having a power supply, wherein the memory device power supply is connected to at least one of the at least one unused buffer.

5. The hardware interface device of claim 1, wherein the connector and the memory device have a signal data and a signal clock line, and further comprising: a resistor connected in series to the signal data line; a resistor connected in series to the clock line; and a pull-up resistor connected to each of the signal data and signal clock lines, each pull-up resistor being lower in value than the series resistor connected to the signal data and signal clock line respectively.

6. The hardware interface of claim 5, further including a ribbon cable with ground shields between and around the signal data line and signal clock line.

7. The hardware interface of claim 1, further comprising; a low-pass frequency RC circuit on the printed wire board assembly to filter noise.

8. The hardware interface of claim 1, further comprising: a common line connecting the memory device power directly to the power supply and the memory device; and circuitry usable to turn the power supply off or on by means of a digital signal.

9. The hardware interface device of claim 1, wherein the self-regulating power supply includes a monitor.

10. The hardware interface device of claim 9, wherein the monitor includes an indicator light.

11. The hardware interface device of claim 10, wherein the connector includes a window to pass light from the indicator light.

12. The hardware interface device of claim 1, wherein the memory element is a customer replacement unit monitor.

13. The hardware interface device of claim 1, wherein the terminal connector is connectable to a central processing unit.

14. The hardware interface device of claim 13, wherein the central processing unit comprises a programming device.

15. A method for eliminating hot socketing between a computer parallel port and a memory device having a power supply where the parallel port and memory device are connected by a parallel connector, comprising: providing a plurality of buffers, at least one of which is unused, in the parallel connector; connecting the memory device power supply to an unused buffer; and programmatically cycling power to the memory device.

16. A hardware interface usable to program one or more electrically erasable read-only memory devices, comprising: a cable; a terminal connector attached to the cable; a printed wire board assembly located in the terminal connector; and digital circuitry provided on the printed wire board assembly which permits power to the one or more electrically erasable read-only memory devices to be switched on and off via the hardware interface.

17. A method of reducing instances of hot-socketing upon connection or disconnection of the hardware interface of claim 1, comprising: removing power to the one or more electrically erasable read-only memory devices via the hardware interface during the connection or disconnection of the hardware interface with respect to the one or more electrically erasable read-only memory devices.

18. A method of reducing instances of hot-socketing upon connection or disconnection of the hardware interface of claim 1, comprising: connecting or disconnecting the hardware interface to the one or more electrically erasable read-only memory devices while power is not applied to the one or more electrically erasable read-only memory devices via the hardware interface.

19. The method of claim 18, further comprising programmatically controlling power to the one or more memory devices via the hardware interface.

\* \* \* \* \*